United States Patent [19]

Deprez et al.

[11] Patent Number: 5,707,775
[45] Date of Patent: *Jan. 13, 1998

[54] IMAGING ELEMENT AND METHOD FOR MAKING A LITHOGRAPHIC PRINTING PLATE ACCORDING TO SILVER SALT DIFFUSION TRANSFER PROCESSING

[75] Inventors: Lode Deprez, Wachtebeke; Ronny De Clercq, Aalter, both of Belgium

[73] Assignee: AGFA-Gevaert, N.V., Mortsel, Belgium

[*] Notice: The term of this patent shall not extend beyond the expiration date of Pat. No. 5,618,650.

[21] Appl. No.: 713,199

[22] Filed: Sep. 12, 1996

Related U.S. Application Data

[60] Provisional application No. 60/007,975, Dec. 5, 1995.

[30] Foreign Application Priority Data

Oct. 20, 1995 [EP] European Pat. Off. ............... 95202843

[51] Int. Cl.$^6$ .................................. G03C 8/28; G03F 7/07
[52] U.S. Cl. .......................... 430/232; 430/204; 430/231
[58] Field of Search ........................... 430/204, 232, 430/231

[56] References Cited

U.S. PATENT DOCUMENTS

| | | | |
|---|---|---|---|
| 3,345,168 | 10/1967 | Wagner et al. | 430/232 |
| 3,709,687 | 1/1973 | Land | 430/204 |
| 4,160,670 | 7/1979 | Tsubai et al. | 430/204 |
| 5,153,097 | 10/1992 | Nishinoiri et al. | 430/204 |
| 5,236,802 | 8/1993 | Yamano et al. | 430/204 |
| 5,437,957 | 8/1995 | Yamano et al. | 430/204 |
| 5,618,650 | 4/1997 | De Keyzer et al. | 430/204 |

FOREIGN PATENT DOCUMENTS 0546598  6/1993  European Pat. Off. ............... 430/231

*Primary Examiner*—Richard L. Schilling
*Attorney, Agent, or Firm*—Breiner & Breiner

[57] ABSTRACT

The present invention provides an imaging element for making a lithographic printing plate according to silver salt diffusion transfer processing, said imaging element comprising on a support a silver halide emulsion layer and a receiving layer, said receiving layer comprising (i) physical development nuclei, (ii) an inorganic colloidal substance and (iii) a hydrophilic polymer being a homo- or copolymer of acrylamide or methacrylamide.

7 Claims, No Drawings

IMAGING ELEMENT AND METHOD FOR MAKING A LITHOGRAPHIC PRINTING PLATE ACCORDING TO SILVER SALT DIFFUSION TRANSFER PROCESSING

Benefit is claimed from U.S. Provisional application Ser. No. 60/007,975 filed Dec. 5, 1995.

FIELD OF THE INVENTION

The present invention relates to to an imaging element for making a lithographic printing plate according to the silver salt diffusion transfer process and to a method for making a lithographic printing plate therewith.

BACKGROUND OF THE INVENTION

The principles of the silver complex diffusion transfer reversal process, hereinafter called DTR process, have been described e.g. in U.S. Pat. No. 2,352,014 and in the book "Photographic Silver Halide Diffusion Processes" by André Rott and Edith Weyde, The Focal Press, London and New York, (1972).

In the DTR process non developed silver halide of an information wise exposed photographic silver halide emulsion layer material is transformed with a so called silver halide solvent into soluble silver complex compounds which are allowed to diffuse into an image receiving element and are reduced therein with a developing agent, generally in the presence of physical development nuclei, to form a silver image having reversed image density values ("DTR image") with respect to the black silver image obtained in the exposed areas of the photographic material.

A DTR image bearing material can be used as a planographic printing plate wherein the DTR silver image areas form the water repellant ink receptive areas on a water receptive ink repellant background. The DTR image can be formed in the image receiving layer of a sheet or web material which is a separate element with respect to the photographic silver halide emulsion material (a so called two sheet DTR element) or in the image receiving layer of a so called single support element, also called mono sheet element, which contains at least one photographic silver halide emulsion layer integral with an image receiving layer in water permeable relationship therewith. It is the latter mono sheet version which is preferred for the preparation of offset printing plates by the DTR method. For example the United Kingdom Patent Specification 1,241,661 discloses a method for the production of a planographic printing plate consisting of a sheet material comprising an outer hydrophilic colloid layer on the surface of which there is concentrated a silver image stemming from an underlying exposed silver halide emulsion layer by the silver complex diffusion transfer reversal process. The silver image formed on the surface is suitable for printing images in a lithographic printing process using a dampening liquid.

Commercial lithographic printing plate precursors of the latter type typically contain on a flexible support, e.g. polyester or paper in the order given a base layer serving as an anti-halation layer, a silver halide emulsion layer and a surface layer containing physical development nuclei in which the silver image is formed.

Alternatively, a lithographic printing plate according to the silver salt diffusion transfer processing may be obtained by providing in the order given on a hydrophilic support such as e.g. an aluminum support (see e.g. EP-A-410500), a receiving layer containing physical development nuclei and a silver halide emulsion. Subsequent to exposure and development the plate is rinsed with water or an aqueous liquid to remove the silver halide emulsion layer and other optional layers on top of the receiving layer so as to expose the silver image formed in the receiving layer.

The above lithographic printing plate precursors, also called imaging elements may be camera exposed or they can be exposed by means of a scan exposure e.g. a laser or L.E.D. exposure. The latter offers the advantage that the preparation of the printing plate is simplified in that a paste-up to be used for the exposure of the imaging element can be completely prepared on a computer. This paste-up prepared on the computer is then transferred to an image setter equiped with e.g. laser that takes care of the exposure of the imaging element.

Lithographic printing plates obtained according to the silver salt diffusion transfer process and in particular those having a flexible support are generally limited in printing endurance as compared to the aluminum based printing plates that use a diazo composition or photopolymer composition as the photosensitive coating for making the printing plate. Nevertheless, lithographic printing plates based on a flexible support offer the advantage that they are less expensive than printing plates based on an aluminum support. DTR-plates having an aluminum support offer an advantage of high sensitivity over a large spectral range.

Accordingly, there is a continuing need for improving the printing endurance of silver salt diffusion transfer plates. A possible improvement in printing endurance should preferably not increase the number of copies that have to be disposed of at start-up of the printing process as a result of e.g. bad ink acceptance or ink acceptance at the non image areas.

EP-A-546598 suggests the use of physical development nuclei having an average diameter less than 6 nm and wherein the relative number of nuclei having a diameter of more than 4.5 nm is less than 15% of the total number of nuclei in the image receiving layer, to reduce the ink acceptance in the non-printing areas.

U.S. Pat. No. 4,160,670 discloses specific hydrophilic copolymers for improving the ink repellant properties of the background areas. Amongst the numerous mentioned copolymers there are mentioned copolymers of acrylamide and a comonomer that has affinity for the physical development nuclei such as e.g. pyridine and vinylimidazole.

U.S. Pat. No. 5,236,802 discloses that the presence of polyacrylamide or a copolymer of acrylamide in the physical development nuclei layer or an adjacent layer improves the ink reception of the image areas and further improves the ink repellant properties of the background areas.

U.S. Pat. No. 2,698,237 discloses a DTR-image receiving material comprising an image receiving layer having metal sulfide nuclei precipitated in an aqueous silicium dioxide dispersion. Said nuclei are taught to show a high activity. Furthermore the presence of hydrophilic organic polymers binders in the layer containing physical development nuclei of a mono-sheet DTR material suitable for preparing a lithographic plate has been disclosed in e.g. U.S. Pat. 3,728,114; 4,160,670; 4,606,985; 4,510,228; 4,743,525; 4,879,193; 5,153,097; 5,108,871 and 5,041,354.

SUMMARY OF THE INVENTION

It is an object of the present invention to improve the lithographic performance of DTR-based lithographic printing plates in particular such properties as ink-acceptance of the printing areas, ink-repellance of the background (reducing staining and toning) and the printing endurance.

Further objects of the present invention will become clear from the description hereinafter.

According to the present invention there is provided an imaging element for making a lithographic printing plate according to silver salt diffusion transfer processing, said imaging element comprising on a support a silver halide emulsion layer and a receiving layer, said receiving layer comprising (i) physical development nuclei, (ii) an inorganic colloidal substance and (iii) a hydrophilic polymer being a homo- or copolymer of acrylamide or methacrylamide.

According to the present invention there is also provided a method for making a lithographic printing plate by imagewise exposing an imaging element as defined above and developing a thus obtained image-wise exposed imaging element in the presence of a developing agent and a silver halide solvent using an alkaline processing liquid.

DETAILED DESCRIPTION OF THE INVENTION

It has been found that a combined use of a colloidal inorganic substance and a hydrophilic polymer in accordance with the present invention improve the ink accepting properties of printing areas as well as the ink repellant properties of the background while obtaining a high printing endurance. The term 'hydrophilic polymer' in connection with the present invention is used to indicate that the particular polymer is soluble in water or an aqueous solution to an extent allowing coating of the polymer in an amount of at least 0.05 mg/m$^2$.

Suitable inorganic colloidal substances for use in the present invention are e.g. colloidal silica or colloidal hydrous aluminum silicates. Particularly preferred in the present invention are colloidal clays.

Clays are essentially hydrous aluminum silicates, wherein alkali metals or alkaline-earth metals are present as principal constituents. Also in some clay minerals magnesium or iron or both replace the aluminum wholly or in part. The ultimate chemical constituents of the clay minerals vary not only in amounts, but also in the way in which they are combined or are present in various clay minerals. Natural clays are well known, but it is also possible to prepare synthetic clays in the laboratory, allowing more degrees of freedom that can lead to reproducible tailor made clay products for use in different applications.

From the natural clays smectite clays, including laponites, hectorites and bentonites are well-known and can be used with the present invention. For the smectite clays some substitutions in both octahedral and tetrahedral layers of the crystal lattice may occur, resulting in a small number of interlayer cations. Smectite clays form a group of "swelling" clays which take up water and organic liquids between the composite layers and which have marked cation exchange capacities. From these smectite clays, synthetic chemically pure clays have been produced. They are particularly suitable for use in the present invention.

The clays used in accordance with the invention are preferably smectic clays, more preferably synthetic smectic clays, most preferably synthetic laponites. Preferred synthetic laponite clays for the purposes of this invention are e.g. LAPONITE RD, LAPONITE RDS and LAPONITE JS, trade mark products of LAPORTE INDUSTRIES Limited, London.

Synthetic clays and process for the production thereof have been described in EP-Patent 161 411 B1.

LAPONITE JS is described as a synthetic layered hydrous sodium lithium magnesium fluoro-silicate incorporating an inorganic polyphoshate peptiser. LAPONITE RD is described as a synthetic layered hydrous sodium lithium magnesium silicate incorporating an inorganic polyphoshate peptiser. LAPONITE RDS is described as a synthetic layered hydrous sodium lithium magnesium silicate incorporating an inorganic polyphoshate peptiser. The said silicates appear as free flowing white powder and hydrates well in water to give virtually clear and colourless colloidal dispersions of low viscosity, also called "sols".

An inorganic colloidal substance in accordance with the present invention may be used in various amounts. However, the inorganic colloidal substance is most efficient when used in amounts between 0.1 mg/m$^2$ and 20 mg/m$^2$, more preferably, between 0.5 mg/m$^2$ and 10 mg/m$^2$.

An inorganic colloidal substance in accordance with the present invention may be present during preparation of the physical development nuclei in which case the nuclei can be precipitated on the inorganic colloidal substance, particularly if the inorganic colloidal substance is a clay such as laponite. On the other hand, the inorganic colloidal substance may be added to the coating solution of the physical development nuclei after preparation of the physical development nuclei. In the latter case, the inorganic colloidal substance and the physical development nuclei will be present as discrete particles dispersed in the hydrophilic polymer.

According to a highly preferred embodiment in connection with the present invention, the hydrophilic polymer is polyacrylamide or polymethacrylamide. However, copolymers of (meth) acrylamide may also be used in accordance with the present invention. A particular interesting type of copolymers are those wherein at least one of the comonomers has a heterocyclic ring system having at least a N, O or S atom. Specific examples of heterocyclic rings are imidazoles, imidazolines, pyrazole, thiazolidine, thiazolidone, thiazolone, indazole, pyridine, triazine, benztriazole, tetrazole, etc. . . . Particular examples of comonomers having a heterocyclic group are e.g. vinyl pyridine, vinyl imidazole, vinyl imidazoline, vinyl piperidine, vinyl quinoline, etc.

The above comonomers are preferably present in structural units of the polymeric binder that may amount from 0.1 to 20 mole % of the polymer, preferably 0.5 to 5 mol %. Other comonomers that can be used in conjuction with (meth) acrylamide and optionally in combination with the comonomers listed above are e.g. vinyl monomers such as vinyl acetate, vinyl butyral, vinyl chloride, vinylidene chloride, vinyl (meth) acrylic acids and esters thereof, styrene and derivatives, e.g. sulfonic acid or carboxylic acid substituted styrenes, vinyl ethers, vinylphosphonic acid, maleinic acid and derivatives, etc. . . . The copolymers in accordance with the present invention may be random copolymers, alternating copolymers or block copolymers.

The polymerization degree (number average) of the polymers used in accordance with the present invention is preferably between 20 and 1000. The average polymerization degree in accordance with the present invention is determined using GPC wherein a solution of 0.05 mol/l of sodium chloride in water is used as the eluent, a TSK column 3000 PW and polyethylene glycol as a standard were used. A too low polymerization degree will result in dissolution of the polymers from the plate during processing whereas a too large polymerization degree may present coating difficulties.

The hydrophilic (meth) acrylamide (co)polymers are preferably used in combination with other hydrophilic polymers such as e.g. polyvinyl alcohol and/or poly(meth) acrylic acid. The total amount of (meth) acrylamide (co)polymers and optional additional polymers in the receiving layer is preferably between 0.05 mg/m² and 1.5 g/m².

The hydrophilic polymers used in accordance with the present invention may be added to the coating solution of the receiving layer after the preparation of the physical development nuclei or they may be present during the preparation of the physical development nuclei. The latter is particularly preferred in case a copolymer of (meth) acrylamide and a comonomer having a heterocyclic group is used. A homopolymer of (meth) acrylamide is preferably added to the coating solution after preparation of the physical development nuclei.

Suitable physical development nuclei for use in accordance with the present invention are those commonly employed in the DTR-process e.g. noble metal nuclei e.g. silver, palladium, gold, platinum, sulphides, selenides or telurides of heavy metals e.g. PdS, Ag₂S, AgNiS, CoS etc.. Preferably used are PdS, Ag₂S or AgNiS nuclei.

The physical development nuclei according to the present invention may be prepared according to known procedures. For example the noble metal nuclei may be prepared as described in U.S. Pat. No. 4,304,835. The heavy metal sulphides can be prepared by adding an aqueous solution of heavy metal ions to a solution containing sulphide ions. The obtained nuclei are preferably stabilized by providing a charge thereon and/or using a stabilizer such e.g. a polymer adsorbing on the nuclei surface. Other suitable stabilizers are large organic molecules that readily absorb to the surface of the nuclei. Examples are heterocyclic compounds containing a water solubilizing group such as —COOH, —SO₃H or —SO₂H e.g. tetrazoles containing a water solubilizing group as described in e.g. the European patent application 218752. The amount of nuclei used in the image receiving layer is preferably between 0.02 mg/m² and 10 mg/m².

Preferably said physical development nuclei have an average diameter less than 6 nm and the number of nuclei having a diameter larger than 4.5 nm is less than 15% of the total number of nuclei. Although the size of the nuclei above is expressed by a diameter this does not imply that the nuclei are necessarily spherical. By diameter is meant the diameter of a sphere having an equivalent volume so that the size of nuclei of a variety of shapes can be characterized by the same parameter.

According to a highly preferred embodiment in connection with the present invention, the imaging element comprises on a support in the order given a silver halide emulsion layer and a receiving layer in accordance with the present invention as described above.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single jet method or the double jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride preferably at least 70 mol %, more preferably at least 80 mol % and most preferred at least 95 mol % of silver chloride. The remaining, if any, of the silver halide may be silver bromide and optionally an amount of silver iodide of up to 3 mol %, preferably up to 1.5 mol %. According to a particularly preferred embodiment in connection with the present invention, a silver chloroiodide emulsion is used having up to 2 mol % of silver iodide. A silver chloroiodide emulsion may conveniently prepared by first precipitating silver nitrate together with a water soluble chloride, e.g. sodium chloride and then at the end of precipitation, typically during the last 10% thereof, co-precipitating a water soluble iodide e.g. potassium iodide, so that silver halide grains having silver iodide in its shell are obtained.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of AgNO₃, preferably between $10^{-7}$ and $10^{-6}$ mole per mole of AgNO₃. This results in the building in in the silver halide crystal lattice of minor amounts of Iridium and/or Rhodium, so called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur containing compounds during the chemical ripening stage e.g. allyl isothiocyanate, allyl thiourea, and sodium thiosulphate. Also reducing agents e.g. the tin compounds described in BE P 493,464 and 568,687, and polyamines such as diethylene triamine or derivatives of aminomethane sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochemo 46, 65 72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. homopolar or salt like compounds of mercury with aromatic or heterocyclic rings such as mercaptotriazoles, simple mercury salts, sulphonium mercury double salts and other mercury compounds. Other suitable stabilizers are azaindenes, preferably tetra or penta azaindenes, especially those substituted with hydroxy or amino groups. Compounds of this kind have been described by BIRR in Z. Wiss. Photogr. Photophys. Photochem. 47, 2 27 (1952). Other suitable stabilizers are i.a. heterocyclic mercapto compounds e.g. heterocyclic mercapto compounds substituted with a bulky substituent such as e.g. an alkyl group having at least 5 carbon atoms or aryl group having at least 8 carbon atoms, e.g. a 1-n-heptyl-5-mercaptotetrazole or 3-mercapto-5-heptyl-oxadiazole, phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light screening dyes that absorb scattering light and thus promote the image sharpness. Suitable light absorbing dyes are described in i.a. U.S. Pat. Nos. 4,092,168, 4,311,787 and DE 2,453,217.

More details about the composition, preparation and coating of silver halide emulsions can be found in e.g. Product Licensing Index, Vol. 92, December 1971, publication 9232, p. 107 109. Between the support and the silver halide emulsion layer there is preferably provided a base layer that preferably contains an anti-halation substance such as e.g. light absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have a number average diameter of 2–10 μm and more preferably between 2 μm and 5 μm. The matting agents are generally used in a total amount in the imaging element of 0.1 g/m$^2$ to 2.5 mg/m$^2$. At least part of these matting agents and/or light reflection pigments may also be present in the silver halide emulsion layer the most part, preferably at least 80% by weight however preferably being present in said base-layer although all of the matting agent can be included in the silver halide emulsion layer, the base layer then being substantially free of matting agent. In case all matting agent is provided in the silver halide emulsion layer(s), it is preferred to add a non-water swellable latex in the base-layer. Example of a non-water swellable latex are copolymer of styrene and butadiene, polyethylacrylate, polymethylmethacrylate, copolymers of acrylates, copolymers of methacrylates etc. . . . As a further alternative the light reflecting pigments may be present in a separate layer provided between the antihalation layer and the photosensitive silver halide emulsion layer. Like the emulsion layer the base layer is coated preferably at a pH value below the isoelectric point of the gelatin in the base layer.

In a preferred embodiment in connection with the present invention a backing layer is provided at the non light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a multiple layer pack e.g. a double layer pack.

The hydrophilic layers usually contain gelatin as hydrophilic colloid binder. Mixtures of different gelatins with different viscosities can be used to adjust the theological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast reacting hardeners such as carbamoylpyridinium salts of the type, described in U.S. Pat. No. 4,063,952.

The imaging element used according to the present invention may further comprise various kinds of surface active agents in the photographic emulsion layer or in at least one other hydrophilic colloid layer. Suitable surface active agents include non ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine N oxides; and cationic agents such as alkylamine salts, aliphatic, aromatic, or heterocyclic quaternary ammonium salts, aliphatic or heterocyclic ring containing phosphonium or sulphonium salts. Preferably compounds containing perfluorinated alkyl groups are used. Such surface active agents can be used for various purposes e.g. as coating aids, as compounds preventing electric charges, as compounds improving slidability, as compounds facilitating dispersive emulsification and as compounds preventing or reducing adhesion.

The imaging element of the present invention may further comprise various other additives such as e.g. compounds improving the dimensional stability of the photographic element, UV absorbers, spacing agents and plasticizers.

Suitable additives for improving the dimensional stability of the photographic element are e.g. dispersions of a water soluble or hardly soluble synthetic polymer e.g. polymers of alkyl (meth) acrylates, alkoxy(meth) acrylates, glycidyl (meth)acrylates, (meth) acrylamides, vinyl esters, acrylonitriles, olefins, and styrenes, or copolymers of the above with acrylic acids, methacrylic acids, Alpha Beta unsaturated dicarboxylic acids, hydroxyalkyl (meth) acrylates, sulphoalkyl (meth) acrylates, and styrene sulphonic acids.

Suitable supports of the imaging element in connection with the present invention can be either opaque-or transparent, the latter offering the advantage of exposure through the support so that exposure may be carried out in camera's without reversing mirrors. Specific examples of supports are polyethylene coated paper, polypropylene coated paper, opaque or transparent polyester film in particular polyethylene terephthalate. Aluminum supports or other hydrophilic supports may also be used as set out in the introduction. In that case, the receiving layer will be located between the support and the silver halide emulsion layer.

According to a preferred embodiment in connection with the present invention, a polyester film support is used having a thickness between 0.1 mm and 0.35 mm and having a Young-modulus (E-modulus) of at least 4300N/mm$^2$ and more preferably at least 4500N/mm$^2$. The Young-modulus also called E-modulus in connection with the present invention can be measured according to method A of the ANSI-D882-91 standard.

In a practical embodiment, at least one of the two main directions of orientation of the polyester film, i.e. the machine direction (longitudinal direction) or the direction perpendicular thereto (transverse direction), should have an E-modulus of at least 4300N/mm$^2$.

According to the most preferred embodiment of the present invention the polyester film support is isotropic in the E-modulus i.e. the ratio of E-modulus in longitudinal direction to the transverse direction is between 0.8 and 1.3. The use of an isotropic polyester film support offers the advantage that when the plate is turned 90° the same printing properties are obtained so that manufacturing or-different sizes of the printing plates out of a master roll is simplified.

Such isotropic supports also offer an advantage when the imaging element is to be used in an image-setter for high intensity short time exposure. In this application, several images on one printing plate may be oriented parallel and/or perpendicular to the axis of the printing cylinder in the printing machine. When an isotropic polyester film support is used it will be much easier to obtain a steady print.

On the other hand, when an anisotropic polyester film support is used a larger E-modulus can be obtained because a large E-modulus in one direction generally goes to the detriment of the E-modulus in the direction perpendicular thereto. In order to obtain the benefit of an anisotropic polyester film support, such printing plate should be mounted with its E-modulus of more than 4300N/mm$^2$ perpendicular to the axis of the printing cylinder of the printing press.

A polyester film support is preferably coated with a layer improving the adhesion of the hydrophilic layers.

A particularly suitable adhesion improving layer, comprises a copolymer containing water-soluble monomers and water-insoluble monomers in a molar ratio between 1:99 and 20:80. Preferably the water soluble monomer is a monomer having one or more carboxylic acid groups. An example of an especially preferred copolymer for use in said adhesion improving layer is a polymer containing 1% to 10% by weight, more preferably 1% to 5% by weight of itaconic acid. Suitable polymers containing itaconic acid are e.g. copolymers of itaconic acid and vinylidene chloride, copolymers of itaconic acid, vinylidene chloride and vinylacetate, copolymers of itaconic acid, vinylidene chloride and methyl (meth) acrylate, copolymers of itaconic acid and vinyl chloride, copolymers of itaconic acid, vinyl chloride, vinylidene chloride and methyl(meth) acrylate etc. . . . . A copolymer of itaconic acid, vinylidene chloride and optionally methyl(meth) acrylate wherein the amount of itaconic acid is between 1% and 5%, the amount of vinylidene chloride is between 70% and 95% and the amount of methyl(meth) acrylate is between 0% and 15%. The adhesion improving layer is preferably free of gelatin.

On top of this adhesion improving layer there may be provided a further intermediate layer containing microparticles having an average diameter of less than 50 nm preferably colloidal silica and gelatin preferably in a weight ratio of 1:2 and 2:1.

According to a preferred method of the present invention an imaging element comprising on a support in the order given a silver halide emulsion layer and a receiving layer in accordance with the present invention is image-wise exposed and subsequently developed according to the DTR-process. The DTR mono sheet imaging element in connection with the present invention may be exposed in an apparatus according to its particular application, e.g. a conventional process camera containing a conventional light source or a high intensity short time exposure such as e.g. a laser containing device.

The alkaline processing liquid used for developing the imaging element preferably contains at least part of the silver halide solvent(s). Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones, thiocyanates and thiosulfates. Further suitable silver halide solvents for use in connection with the present invention are described in EP-A 554584. It should be noted that the effects of the present invention are particularly noticed when as silver halide solvents a combination of an alkanol amine and a meso-ionic thiolate compound, preferably a meso-ionic triazolium thiolate, is used.

According to the present invention the alkaline processing liquid preferably also contains hydrophobizing agents for improving the hydrophobicity of the silver image obtained in the image receiving surface layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. Nos. 3,776,728, 4,563,410 and EP-A 554584.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium sequestering compounds, anti sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. No. 3,038,805, 4,038,075, 4,292,400, 4,975,354.

Subsequent to the development in an alkaline processing liquid the surface of the printing plate is preferably neutralized using a neutralization liquid.

A neutralization liquid generally has a pH between 5 and 7. The neutralization liquid preferably contains a buffer e.g. a phosphate buffer, a citrate buffer or mixture thereof. The neutralization solution can further contain bactericids, e.g. phenol, thymol, turpinal or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Further the neutralization solution can contain wetting agents, preferably compounds containing perfluorinated alkyl groups.

The invention will now be illustrated by the following examples without however the intention to limit the invention thereto. All parts are by weight unless otherwise specified.

EXAMPLE

Preparation of the silver halide emulsion coating solution.

A silver chlorobromide emulsion composed of 98.2 mol % of chloride and 1.8 mol % of bromide was prepared by the double jet precipitation method. The average silver halide grain size was 0.38 μm (diameter of a sphere with equivalent average volume) and contained Rhodium ions as internal dopant. The emulsion was orthochromatically sensitized and stabilized by a 1-phenyl-5-mercapto-tetrazole.

Preparation of the imaging elements

Four polyethylene terephthalate film support having a thickness of 175 μm and being provided with a adhesion improving layer were each coated with a layer containing gelatin in an amount of 0.4 g/m² and colloidal silica having an average particle diameter of 7 nm in an amount of 0.4 g/m². The adhesion improving layer contained a copolymer of iraconic acid (2%), vinylidene chloride (88%) and methylmethacrylate (10%).

A silver halide emulsion prepared as described above was coated to each of these coated polyethylene terephthalate film supports together with an anti-halation layer (underlying the silver halide emulsion layer) such that the amount of gelatin in the anti-halation layer was 2.7 g/m² and 1.34 g/m² for the silver halide emulsion layer. The amount of silver halide expressed as AgNO₃ was 1.25 g/m² and the emulsion layer further contained developing agents and 120 mg/m² of formaldehyde as a hardener. The anti-halation layer further contained a silica matting agent having an average particle size (weight average diameter) of 3.4 μm and carbon black as anti-halation means. The thus obtained elements were kept at 57° C. at a relative humidity of 34% for 1 day. To an element thus obtained was coated a PdS nuclei layer, the nuclei having a number average diameter of 1.8 nm and the fraction having a diameter of more than 4.5 nm was 2%. The nuclei were prepared as described in Example 2 of EP 546598 and contained polyvinyl alcohol as a stabilizer.

Several elements were obtained as described above but with additions of a laponite and/or polyacrylamide as set forth in table 1 below. The nuclei layer for each of the four elements also contained 0.4 g/m² of hydroquinone and 30 mg of formaldehyde. After coating of the surface layer, the elements were kept for 1 day at 57° C. at a relative humidity of 34%.

The following alkaline processing solution was prepared:

| | |
|---|---|
| sodium hydroxide (g) | 30 |
| methylhydroquinone (g) | 2 |
| sodium sulphite anh. (g) | 35 |
| amino-ethylaminoethanol (ml) | 45 |
| compound A (see below) (g) | 0.8 |
| EDTA.4Na (g) | 1 |
| 3-mercapto-5-n.heptyl-oxadiazole (g) | 0.35 |
| water to make | 1 liter |

EDTA.4Na=sodium salt of ethylenediamine tetra-acetic acid

Compound A:

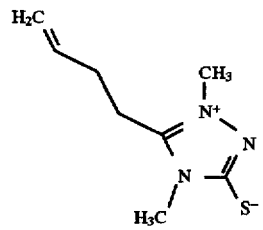

The following neutralization solution was prepared:

| | |
|---|---|
| citric acid | 10 g |
| sodium citrate | 35 g |
| sodium sulphite anh. | 5 g |
| phenol | 50 mg |
| water to make | 1 l |

The following dampening liquid was prepared:

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The above described imaging elements were image-wise exposed and processed at 30° C. with the above described alkaline processing solution, subsequently neutralized at 25° C. with the neutralization solution described above and dried.

The printing plates thus prepared were mounted on an offset printing machine (two color GTO printing machine). During the printing run the described dampening solution was used. Printing results for each of the printing plates was evaluated in terms of printing endurance, toning (ink acceptance in the non-image areas during start-up) and ink acceptance.

Toning was evaluated as the number of copies that are needed before a clear copy free of toning is obtained:
x: >350
_: 150–350
Δ: 50–150
o: <50

The number ink acceptance was evaluated in fresh processing liquids (fresh) and in processing liquids that were in use for a substantial amount of time (reg.) as the number of copies needed to obtain a stable density of the image:
x: >75
_:50–75
Δ:20–50
o: <20

The printing endurance was evaluated as the number of copies of acceptable quality that could be obtained:
x: <5000
_:5000–15000
Δ:15000–30000
o: >30000

TABLE 1

| Sample | Laponite (mg/m²) | PAM (mg/m²) | Toning | Ink accept. fresh | Ink accept. reg | Print. end. |
|---|---|---|---|---|---|---|
| 1 | 0 | 0 | x | o | Δ | o |
| 2 | 2 | 0 | — | o | Δ | Δ |
| 3 | 0 | 2.5 | — | o | Δ | Δ |
| 4 | 0 | 5 | Δ | o | — | — |
| 5 | 0 | 10 | o | o | x | o |
| 6 | 2 | 2.5 | Δ | o | Δ | Δ |
| 7 | 2 | 5 | o | o | Δ | o |
| 8 | 2 | 10 | o | o | Δ | o |

PAM = polyacrylamide

EXAMPLE 2

Imaging elements and printing plates were obtained as described in example 1 but with the modification that instead of polyacrylamide, a copolymer of 99 mol % acrylamide and 1 mol % styrene (PAMS) was used and further polyacrylic acid (PAZ) was added in the amounts indicated in table 2.

Evaluation of the printing plates was made as described in example 1.

| Sample | Laponite (mg/m²) | PAMS (mg/m²) | PAZ | Toning | Ink accept. fresh/reg. | Print end. |
|---|---|---|---|---|---|---|
| 9 | 2 | 0 | 0 | — | o/Δ | x |
| 10 | 2 | 4 | 0 | o | o/Δ | o |
| 11 | 4 | 0 | 0 | Δ | o/Δ | x |
| 12 | 6 | 0 | 0 | — | Δ/x | x |
| 13 | 2 | 2.5 | 20 | o | o/Δ | o |

We claim:

1. An imaging element for making a lithographic printing plate according to silver salt diffusion transfer processing, said imaging element comprising on a support a silver halide emulsion layer and a receiving layer, said receiving layer comprising (i) physical development nuclei, (ii) an inorganic colloidal substance and (iii) a hydrophilic polymer which is a homo- or copolymer of acrylamide or methacrylamide, wherein said inorganic colloidal substance is a synthetic smectite clay or a synthetic laponite clay and wherein said physical development nuclei have an average diameter less than 6 nm and the number of nuclei having a diameter larger than 4.5 nm is less than 15% of the total number of nuclei.

2. An imaging element according to claim 1 wherein said inorganic colloidal substance and said physical development nuclei are dispersed as discrete particles in said hydrophilic polymer.

3. An imaging element according to claim 1 wherein said hydrophilic polymer is a copolymer of acrylamide or methacrylamide and a comonomer having a heterocyclic group having at least a N, O or S atom.

4. An imaging element according to claim 3 wherein said comonomer has an imidazole or pyridine group.

5. An imaging element according to claim 1 wherein said hydrophilic polymer is a copolymer of acrylamide or methacrylamide and one or more comonomers selected from the group consisting of vinylimidazool, styrene, acrylic acid, methacrylic acid, an acrylic acid ester, a methacrylic acid ester, vinyl acetate, vinyl chloride, vinylidene chloride, itaconic acid, vinyl pyrrolidone and vinyl pyridine.

6. An imaging element according to claim 1 wherein said image receiving layer further comprises a polyvinyl alcohol and/or a poly(meth)acrylic acid.

7. Use of an imaging element as defined in any of claims 1 to 6 for making a lithographic printing plate according to the silver salt diffusion transfer processing by exposing said imaging element and developing said exposed imaging element with an aqueous alkaline solution in the presence of a developer and a silver halide solvent.

* * * * *